United States Patent [19]

Sauer

[11] Patent Number: 4,639,898
[45] Date of Patent: Jan. 27, 1987

[54] BIT-LINE PULL-UP CIRCUIT

[75] Inventor: Donald J. Sauer, Allentown, N.J.

[73] Assignee: RCA Corporation, Princeton, N.J.

[21] Appl. No.: 685,251

[22] Filed: Dec. 21, 1984

[51] Int. Cl.⁴ ............................................. G11C 11/40
[52] U.S. Cl. .................................... 365/202; 307/548
[58] Field of Search ............... 365/202, 203, 204, 227, 365/200; 307/548; 323/908

[56] References Cited
U.S. PATENT DOCUMENTS
4,451,907 5/1984 Donoghue et al. ................. 365/203
4,499,559 2/1985 Kurafuji ............................... 365/203

Primary Examiner—Terrell W. Fears
Attorney, Agent, or Firm—Joseph S. Tripoli; Henry I. Schanzer

[57] ABSTRACT

A memory array in which a pull-up network for the bit lines includes a relatively high impedance low power dissipation static network which tends to maintain the bit lines at a given level during standby, and a relatively low impedance network which is momentarily pulsed into conduction prior to a read and/or a write cycle for quickly precharging the bit lines to the given level.

6 Claims, 4 Drawing Figures

BIT-LINE PULL-UP CIRCUIT

This invention relates to means for precharging the bit lines of a high density memory array.

In a high density memory array, many column conductors used as bit lines and to distribute the operating potential to the memory elements are formed very close to each other. For example, FIG. 1 shows a portion of the interconnection pattern of a high density array, in which each one of the column conductors (e.g. 10, 12, 14, 10', 12' and 14') is 3 microns wide and is spaced 2.5 microns from an adjacent column conductor. In FIG. 1, the column conductors 10 and 12 (or 10' and 12') function as the bit lines for a column of memory cells while conductors 14 and 14' function as ground lines for the memory cells of their associated columns.

Due to the proximity of the bit lines (e.g. 10 and 12) to the ground line (e.g. 14) it is possible for the bit lines to be shorted to ground. The possibility of a short is even more likely in memory arrays of higher density than the one shown FIG. 1, since, in higher density arrays, the distance between adjacent columns would be proportionately reduced (although the width of each column conductor would also be reduced). When a bit line is shorted to ground the column of memory cells associated with that bit line is, in effect, defective and the memory array would then, normally, be rendered useless. To remedy this problem, many high density memories are provided with spare (or "redundant") columns of cells which can be selectively substituted for defective columns. The substitution of a good spare column for a defective column enables the memory array to be operable as originally designed.

However, several significant problems still exist. In some memory systems, the bit lines are pulled-up statically via "moderate" impedance means to a preselected potential to: (a) prevent the memory cells from being upset during stand-by as well as during a read or write cycle; and (b) increase the speed of response of the system by biasing it in a preferred state.

The static (i.e. constant or permanent) connection of all the bit lines (i.e. the "good" ones as well as the defective ones) via a "moderate" impedance means gives rise to a significant problem because the constant (i.e. standby) power dissipation due to the defective "shorted" bit line(s) becomes excessive and renders unacceptable the otherwise operable memory array. Thus, although the memory array can be repaired by substituting a good spare column (or row) for a defective column, the end result is not acceptable if the constant current drain to ground due to a defective column is high. That is, the replacement of a defective column by a "good" spare column is not a useful solution when the power dissipation and current drain exceeds acceptable levels.

It was thought that the problem resulting from the static power dissipation could be solved by using a pulsed precharged system to preset the bit lines to a desired level. Applicant's invention resides in part in the recognition that the precharged bit lines would tend to discharge between precharge pulses (e.g. during the stand-by mode). The discharge of the bit lines would: (a) lower noise margins allowing the information stored in the memory cells to be easily upset; and (b) cause large transient currents to flow during precharge. Thus, applicant recognized that while precharging would ameliorate the power dissipation problem, means were still needed to prevent the discharge (or charging) of the bit lines below some level.

Accordingly, circuits embodying the invention include the combination of a high impedance, low power dissipation, static pull-up network connected to the bit lines which tends to maintain the "good" bit lines at a given level during stand-by, and a pull-up circuit, also connected to the bit lines, which is momentarily pulsed to precharge the bit lines to a desired level at the onset of each read or write cycle.

In the accompanying drawing like reference characters denote like components, and;

Figure 1:
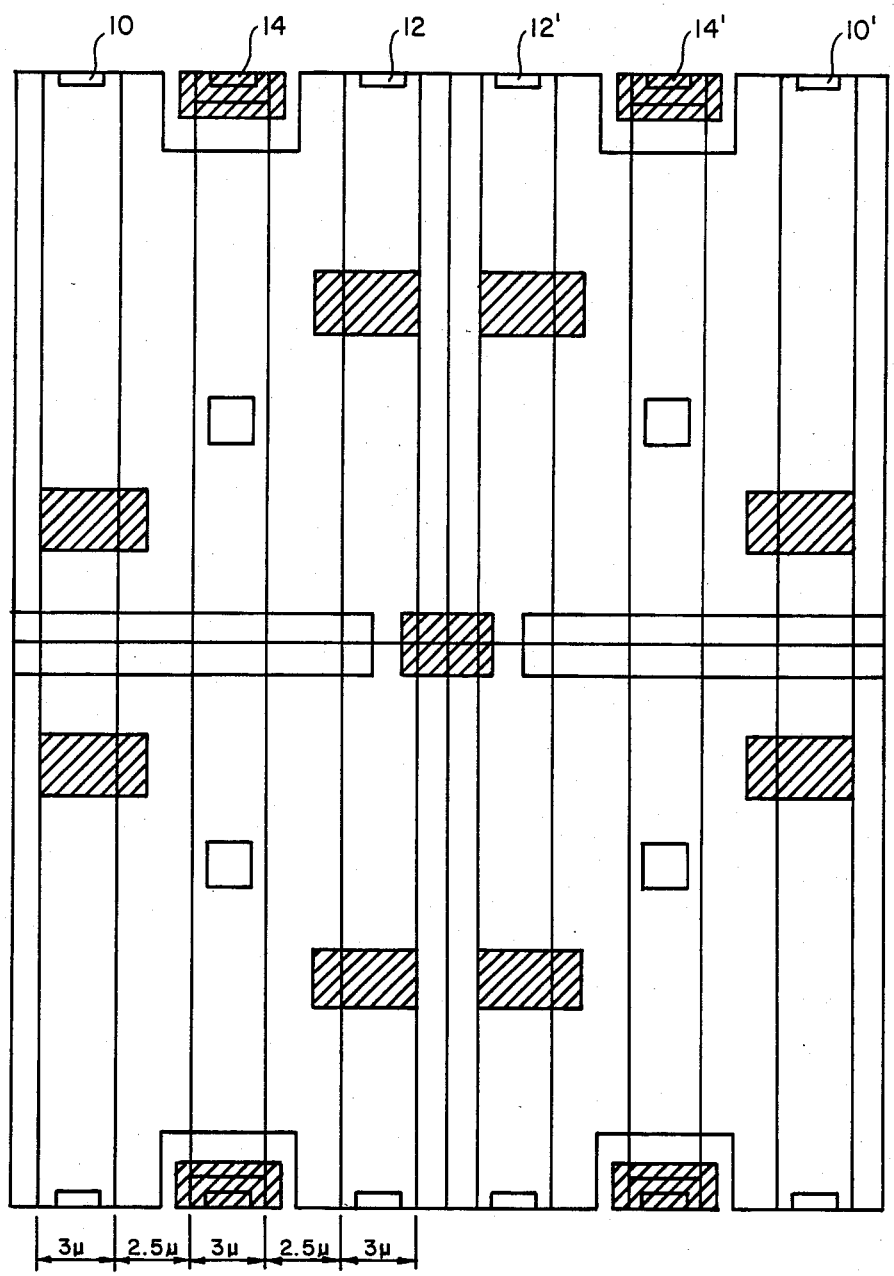
FIG. 1 is a top view of a layout of a portion of a high density memory array.

The active devices which are preferred for use in practicing the invention are those of a class known in the art as insulated-gate field-effect transistors (IGFETs). For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P-conductivity type are identified by the letter P followed by a particular reference numeral, and enhancement type IGFETs of N-conductivity type are identified by the letter N followed by a particular reference numeral. The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.

2. Conduction occurs when the applied gate-to-source potential ($V_{GS}$) is in a direction to turn on the transistor and is greater in magnitude than a given value, which is defined as the threshold voltage ($V_T$) of the transistor. To turn on a P-type enhancement IGFET its gate voltage ($V_G$) has to be more negative than its source voltage ($V_S$) by at least $V_T$. To turn on an N-type enhancement IGFET its $V_G$ has to be more positive than its $V_S$ by $V_T$.

3. IGFETs are bidirectional in the sense that when an enabling signal is applied to the control electrode, current can flow in either direction in the conduction path defined by the first and second electrodes, i.e. the source and drain are interchangeable.

In the discussion to follow, a potential at, or near ground is arbitrarily defined as a logic "0" or "low" condition and any potential at or near $+V_{DD}$ or $+V$ volts is arbitrarily defined as a logic "1" or "high" condition.

Figure 2:
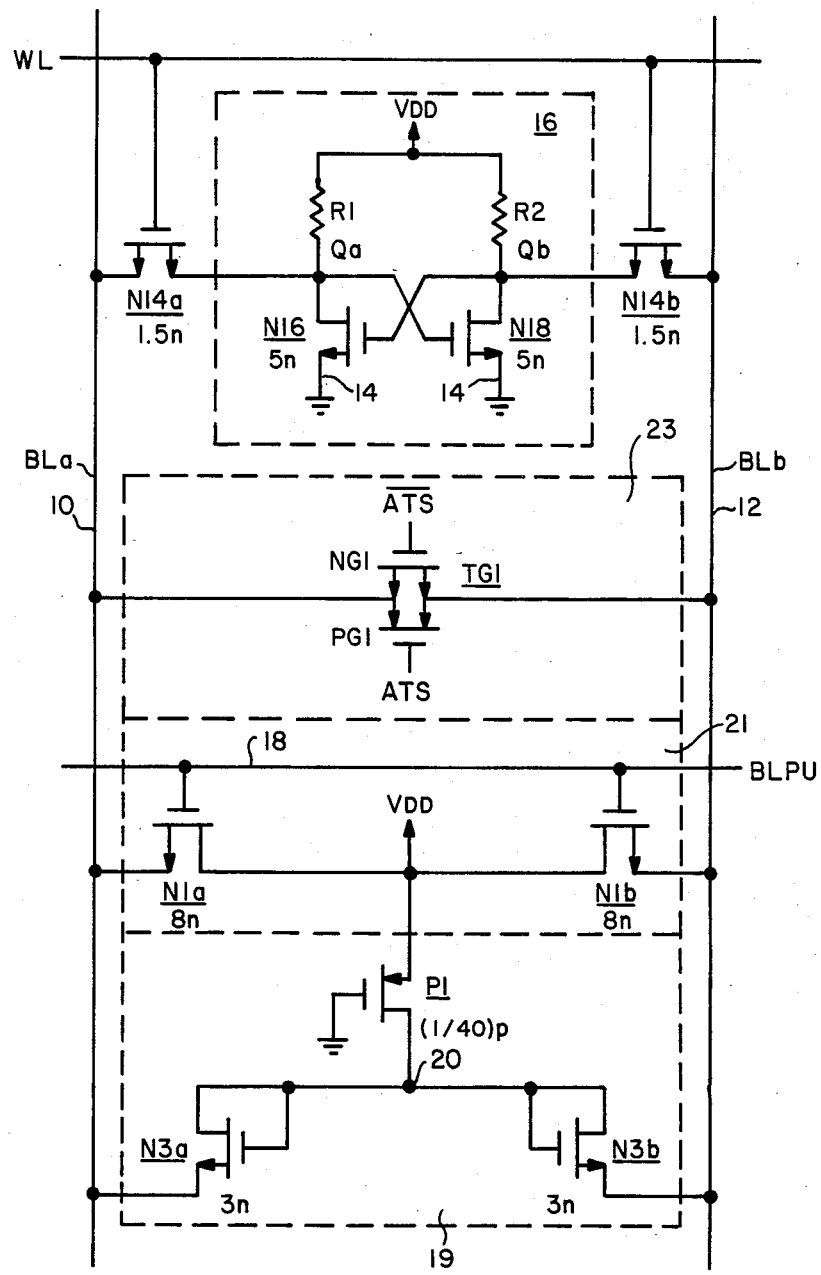
FIG. 2 is a schematic diagram of circuitry embodying the invention.

The circuit of FIG. 2 shows one cell 16 of a memory array comprised of many cells arranged in numerous rows and columns. However, for ease of illustration only one cell of one column is shown. Memory cell 16 has two, complementary, input/output (I/O) points, Qa and Qb. The I/O points (Qa, Qb) of memory cell 16 are coupled to their associated bit lines BLa and BLb, by means of two addressing IGFETs, N14a and N14b, respectively. The gate electrodes of N14a and N14b are connected to a word line (WL). When a "high" potential (e.g., $V_{DD}$ volts) is applied to line WL, transistors N14a and N14b are selected (i.e. turned-on) and the I/O points (Qa, Qb) of cell 16 are then tightly coupled to their respective bit-lines BLa and BLb. Normally, the word line (WL) is driven to the high (e.g. $V_{DD}$) level only when it is desired to read-out the information contained in memory cell 16 onto the bit lines, or when it is desired to write information from the bit lines into memory cell 16. Otherwise, the word line is driven or held at a low (e.g. ground) potential.

Prior to each read or write cycle, the bit-lines of the memory array are precharged to a level which is approximately equal to $[V_{DD}-V_{TN}]$ volts, where $V_{DD}$ is equal to the supply voltage applied to the memory cell and $V_{TN}$ is the threshold voltage of the N-type IGFETs. In a memory array of the type shown in FIG. 2, maintaining and precharging the bit-lines to $[V_{DD}-V_{TN}]$ volts provides a high level of noise immunity and reduces significantly the chance of any cell being mistakenly upset during a read or a write cycle.

The circuitry used to charge and precharge the bit-lines includes a high impedance "Keeper" network 19, a moderate impedance pull-up network 21, and an equalizing clamp network 23, which are detailed below.

The high impedance, low power dissipation, static "Keeper" pull-up network 19 is comprised of a P-type IGFET P1 and IGFETs N3a and N3b connected as diodes. P1 has its source-to-drain path connected between $V_{DD}$ volts and a node 20 and its gate electrode returned to ground potential. IGFETs N3a and N3b have their gates and drains connected to node 20 and their source electrodes connected to bit lines BLa and BLb, respectively. P1 is a very small device, [shown as 1/40 p in FIG. 2] and is intentionally designed to be a very high impedance device to limit the constant (static) current flow therethrough. By way of example, it may be assumed that P1, when formed and forward biased as shown, functions as, or is equivalent to, a 2 megohm resistor. Hence, P1 limits the current that can flow from the $V_{DD}$ power supply via its conduction path and the conduction paths of N3a and N3b into bit lines BLa and BLb. Thus, even when the bit lines BLa and/or BLb are shorted to ground potential, the steady state current that can flow from the $V_{DD}$ supply to ground is limited. Transistors P1, N3a, and N3b thus function as a static, high impedance, low current, pull-up "keeper" circuit tending to either: (a) maintain BLa and BLb at, or close to, $(V_{DD}-V_{TN})$ volts in a stand-by mode; or (b) following the discharge of one of these lines to ground, during an active cycle, pull the discharged bit line(s) towards $[V_{DD}-V_{TN}]$ volts, albeit very slowly.

The stand-by mode as used herein refers to the memory array being either deselected or being between active cycles. An "active cycle" as used herein occurs when either: (a) precharge transistors N1a and N1b are turned-on; or (b) when N1a and N1b are turned-off and address transistors N14a and N14b are turned-on with information being either read out of the memory cell or written into the memory cell.

The use of the high impedance "keeper" circuit is unique in that it allows the possibility of one or both of the bit lines being shorted to ground without a resultant excessive power dissipation level. Admittedly, if a short exists, a steady state current is drawn through P1, but, since P1 is a very high impedance device, the maximum static current that can flow through a shorted bit line to ground is in the range of two (2) microamperes when $V_{DD}$ is at, or close to, 5 volts. Thus, by way of example, if BLa and BLb were defective and shorted to ground and were replaced by a redundant column of elements and bit lines (not shown), the power dissipation of the defective and useless column would be in the range of 10 microwatts with $V_{DD}$ at 5 volts. Thus, while the defective bit lines would be at or close to ground potential, the "good" bit lines would be at, or tend to go to, $(V_{DD}-V_{TN})$ volts.

Due to its high impedance, "keeper" network 19 has little, if any, effect on circuit operation during an active cycle. By way of example, assume that transistors N14a and N14b are turned-on and that the information in memory cell 16 is to be read out onto the bit lines. If Qa is low and Qb is high, Qa-low will cause bit line BLa to be driven, or go, to, or close to, ground potential, while Qb-high allows bit line BLb to remain high. BLa is driven to the low level because P1 is a high impedance device and the very small current through P1 and N3a is easily sunk by transistor N16 which is designed to be a relatively large, low impedance, device. In an analogous manner, Qa-high and Qa-low results in BLb being driven quickly and easily to the "low" level while BLa remains at the "high" level.

The pulsed pull-up network 21 is comprised of IGFETs N1a and N1b having their drains connected to $V_{DD}$ volts, their gates connected to a control line 18 to which is applied a bit-line pull-up control signal (BLPU), and their sources connected to bit lines BLa and BLb, respectively. When the control signal BLPU is driven high (e.g. to $V_{DD}$ volts), N1a and N1b are turned-on. N1a and N1b are designed to have a lower "ON" source-to-drain impedance than the impedances of transistors N16 and N18 for like bias conditions. [The relative size of some of the IGFETs is indicated in FIG. 2 by a "number" preceding either the letter "η" or the letter "p", where "η" refers an N type IGFET and "p" refers to a P-type IGFET. This size (W/L) of a 1·η or a 1·p device is W=1 micron and L=2 microns. Hence, the size of the device is proportional to the "number" multiplied by its corresponding "p" or "η" value. In FIG. 2, the ON impedance of N1a and N1b is ⅓th the ON impedance of N16 or N18. When N1a and N1b are turned on, they conduct in the source follower mode and drive their associated bit lines BLa and BLb relatively quickly to $[V_{DD}-V_{TN}]$ volts. N1a and N1b are normally pulsed-on for a short period of time to ensure that all the bit lines, such as BLa and BLb, are precharged to a level which is approximately equal to $[V_{DD}-V_{TN}]$ volts whenever a read cycle or a write cycle is about to occur. Under normal operation, when all the bit lines (e.g. 128, or more, bit-line pairs) of the array are good, there is a substantial dynamic power dissipation ($P=CV^2f$) due to the discharging and precharging of the bit lines. Evidently, if a bit line is shorted to ground, additional power will be dissipated since the bit line is being discharged to, or held at, ground. Hence, if bit lines BLa and BLb are shorted to ground there is an increase in the instantaneous power dissipation. However, the average power dissipation of the system is not significantly increased where the shorted (defective) bit lines are a small percentage of the total number of good bit lines. Also, N1a and N1b are only turned-on momentarily and have moderate impedances allowing only moderate currents to flow, hence the average power dissipation is not increased excessively. By way of example, N1a and N1b are turned-on by the BLPU pulse whose pulse width is typically set at 80 nanoseconds.

Under normal conditions N1a and N1b conduct in the source follower mode when a high (e.g. $V_{DD}$) is applied to their gate electrodes and charge the bit lines BLa and BLb to ($V_{DD}-V_{TN}$) volts. When, due to a defect, bit line BLa, and/or BLb, is shorted to ground and a "high" is applied to the gate electrodes of N1a and N1b, these transistors conduct in the common source mode. However, the power dissipation of the pull-up circuit is limited by the sizing of devices N1a and N1b. As noted above, the "ON" impedance of N1a and N1b is ⅔th the "ON" impedance of N16 and N18. Transistors N1a and N1b with 5 volts at their gates and drains and with their sources grounded (due to the short at BLa and/or BLb) may be assumed to have an effective source-to-drain resistance of 2.5K ohms. Thus, the "ON" impedance is "moderate" (i.e. 2.5K ohms) and the current that can flow to ground is limited. That is, with $V_{DD}$ at 5 volts a maximum of two (2) milliamperes would flow through a "shorted" bit line to ground. Admittedly, there is additional instantaneous power dissipation when N1a and N1b are turned-on. However, as noted above, where the shorted bit line or lines are a small percentage (e.g. one of 128) of the bit line pairs and the total operating current is in the range of fifty (50) milliamperes, the additional 2 milliamperes of current drawn during precharge due to the shorted bit lines does not add significantly to the overall power dissipation. Furthermore, transistors N1a and N1b are turned-on for only a small portion of each cycle. Ergo, the total instantaneous operating power dissipation is not significantly increased and the average power dissipation remains low.

Thus in a memory which includes redundant columns which can be substituted for defective columns, the pull-up circuitry of the invention enables the possibility of both bit lines being shorted and yet not draw any significant steady state (i.e. stand by) current.

Network 23 includes a complementary transmission gate TG1 comprised of an N-type transistor, NG1, and a P-type transistor, PG1. The conduction paths of NG1 and PG1 are connected in parallel between bit lines BLa and BLb for selectively shorting the two bit lines together and eliminating differential signals across the two bit line pairs. An active time signal (ATS) is applied to the gate electrode of PG1, and the complement of ATS (i.e. $\overline{ATS}$) is applied to gate electrode of NG1. When ATS is low and $\overline{ATS}$ is high, NG1 and PG1 are both turned-on and bit lines BLa and BLb are then placed and held at essentially the same potential. When ATS is high and $\overline{ATS}$ is low, NG1 and PG1 are turned-off and the bit lines can then assume different voltage levels. TG1 is turned-on to hold bit lines BLa and BLb at the same potential during precharge and after a read or a write operation.

Figure 3:
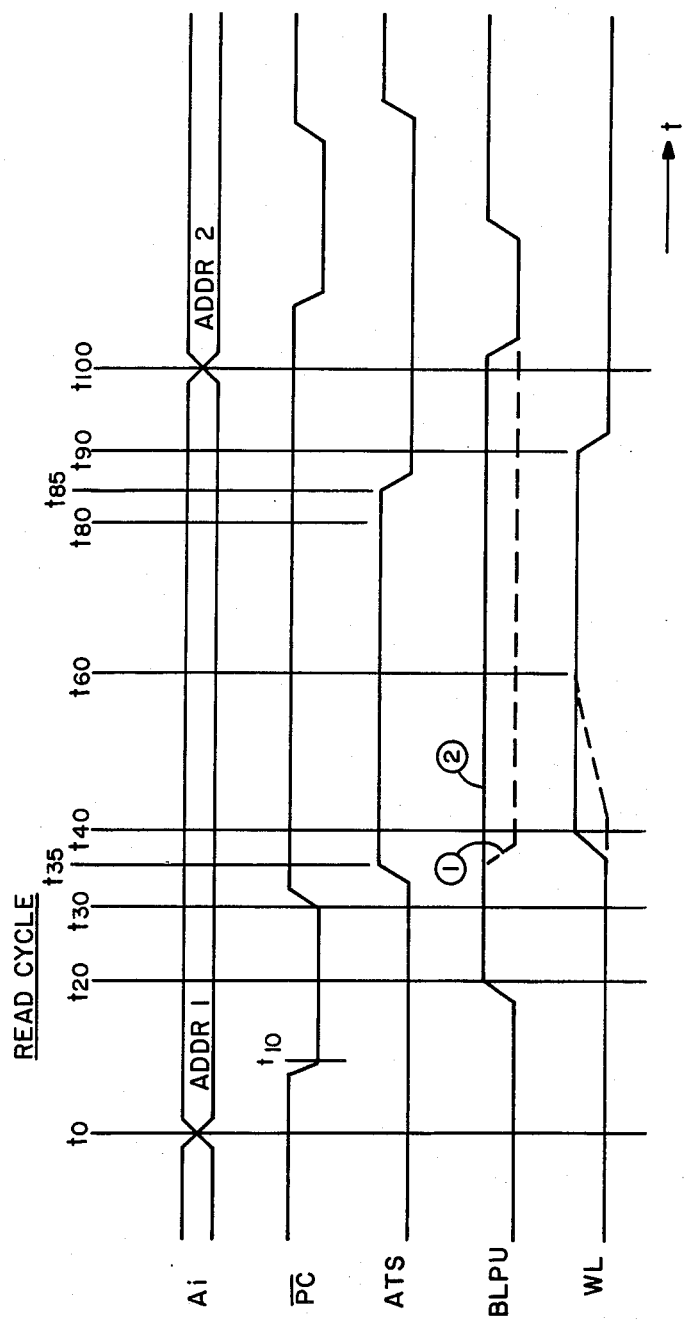
FIG. 3 is a diagram of waveforms associated with the circuitry of FIG. 2.
Figure 4:
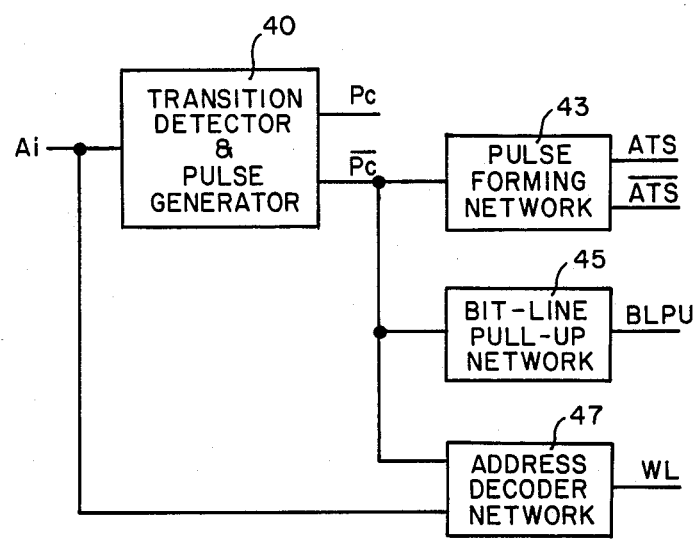
FIG. 4 is a portion of a memory system embodying the invention.

The operation of the portion of the memory array shown in FIG. 2 will now be outlined with reference to the waveform diagrams of FIG. 3 and the pulse forming circuitry shown in FIG. 4.

A read cycle is initiated at time $t_0$ when any address signal (Ai) makes a transition (from high-to-low or low-to-high). As shown in FIG. 4, the addresses are applied to a transition detector and pulse forming network 41. Network 41 produces a precharge pulse ($\overline{PC}$) in response to any address transition at its input. As shown in FIG. 3, $\overline{PC}$ goes negative from time $t_{10}$ after $t_0$ to time $t_{30}$. The precharge pulse ($\overline{PC}$) is applied to network 43 to produce the ATS and $\overline{ATS}$ signal. As shown in FIG. 3, ATS goes high (and $\overline{ATS}$ goes low) from time $t_{35}$ to time $t_{85}$ to turn-off TG1 and enable the contents of the memory cell to be read out onto bit lines BLa and BLb.

The $\overline{PC}$ pulse is also applied to a bit-line pull-up (BLPU) pulse forming network to produce the BLPU pulse applied to line 18 of network 21. As shown in FIG. 3, the BLPU pulse goes positive at time $t_{20}$ and may be designed to be either: (a) a relatively short pulse (waveform 1) ending at time $t_{35}$ prior to read-out; or (b) a relatively long pulse (waveform 2) ending after read-out at time $t_{95}$. The reasons for making BLPU shorter 1 or longer 2 are discussed below. As shown in FIG. 4, the $\overline{PC}$ pulse and the input addresses are applied to an address decoder 47. The decoder applies "high" - WL signal on a selected line. For ease of illustration only one address input (Ai) and one WL line output are shown in the Figures. However it should be understood that all the address lines are applied to the memory decoders whose outputs are connected to, and supply, all the word lines of the memory array. As shown in FIG. 3, the WL pulse of the selected line, corresponding to Ai, goes high at time $t_{40}$ and remains high until time $t_{90}$ to ensure a valid read-out of the memory cell, 16, contents.

The signal produced on BLa and BLb will now be examined for the following two conditions: (a) when the BLPU pulse ends prior to read-out (i.e. before WL goes high); and (b) when the BLPU pulse ends after read-out (i.e. after WL returns low).

When the BLPU pulse is "high" and WL is "low", N1a and N1b are turned-on and ensure that bit line BLa and BLb are quickly precharged to ($V_{DD}-V_{TN}$) volts. If the BLPU pulse is terminated prior to read-out, as shown in waveform 1, transistors N1a and N1b are turned-off before time $t_{40}$. At time $t_{40}$ the WL pulse goes high and N14a and N14b are turned-on. The contents of memory cell 16 are then read-out onto bit lines BLa and BLb. Due to the symmetry of the memory cell and the address circuitry, only one of the two bistable conditions of cell 16 need be described. Assume that Qa is low (i.e. transistor N16 is conducting) and hence that Qb is high (i.e. transistor N18 is non-conducting). Assume further that the impedance of R1 and R2 is $1\times 10^{10}$ ohms and that the equivalent ON impedance of Qa is 4K ohms, while that of N14a or N14b (conducting in the common source mode) is 14K ohms.

Analysis of the circuit of FIG. 2 indicates that the following networks connected in parallel will tend to pass current between $V_{DD}$ and Qa:
(1) R1; and (2) P1 in series with N3a and via N14a.

Assume $V_{DD}$ to be at 5 volts, the ON impedance ($Z_{ON}$) of P1 to be equal to 2 megohms, the $V_{TN}$ of N3a to be 1 volt, and the $Z_{ON}$ of N14a to be 14K ohms, and R1 to be $10^{10}$ ohms. For these values, Qa will be close to zero volts due to the negligible current through R1 and the very low current through P1, N3a and N14a. Bit line BLa will be pulled down to a potential which is approximately 32 millivolts above the voltage at Qa. Hence, for all practical purposes BLa and Qa will be very close to zero volts. Qb is "high" and at, or close to, $V_{DD}$ volts. The gate of N14b is at $V_{DD}$ volts and its source (connected to BLb) is at $(V_{DD}-V_{TN})$ volts. Hence N14b is non-conducting and neither is N3b. Hence line BLb remains at $(V_{DD}-V_{TN})$ volts.

After read-out and the discharge of BLa to ground, with BLb remaining at $(V_{DD}-V_{TN})$ volts, WL goes low and the information on bit lines BLa and BLb is then transferred to a sense amplifier (not shown). [In practice the transfer to the sense amplifier may occur during the read-out period (i.e. time $t_{60}-t_{40}$)].

In order to reduce the recovery time of the system at the end of a read cycle, it is often desirable that the bit-line on which a "zero" (i.e. a "low") is read-out not be pulled all the way down to ground. Of course, the bit line should be pulled down to an extent sufficient to indicate the presence of a "low", but not all the way to ground. Obviously, this enables the bit line to, subsequently, be brought back to $(V_{DD}-V_{TN})$ volts much faster.

In the circuit of FIG. 2, this is accomplished by applying the BLPU pulse during read-out per waveform 2 in FIG. 3. Assuming as before that Qa is "low" and Qb is "high", and that N1a and N1b are turned-on while WL is "high", analysis of the circuit indicates the following:

(a) P1 and N3a are connected in parallel with N1a between $V_{DD}$ and bit line BLa. Since P1 is 2 megohm and the $Z_{ON}$ of N1 is 2.5K ohms, the effect of P1 and N3a is negligible and may be neglected;

(b) Neglecting P1 and N3a, N1a is connected in series with N14 and in parallel with R1 between $V_{DD}$ and Qa. Neglecting the current through R1, and assuming the $Z_{ON}$ of N1a, N14a and N16 to be respectively, 2.5K ohms, 14K ohms and 4K ohms, and further recognizing that N1a is in current saturation, the voltage at Qa is approximately equal to 0.8 volts, and the voltage on the bit line is approximately equal to 3.5 volts.

A significant feature of the sizing of N1a and N1b thus becomes apparent. N1a and N1b can be used to precharge the bit lines and as loads to prevent the bit lines from being pulled down very low. This, as noted above, enables the bit lines to be precharged back to $V_{DD}-V_{TN}$ very quickly, thus reducing the down or refresh time necessary to prepare the memory for the next read or write cycle.

In the description, reference was made to column and column conductors. It should be evident that reference could as well have been made to row and row conductors and that what is applicable to one (e.g. columns) is equally applicable to the other (e.g. rows) where appropriate.

What is claimed is:

1. In a memory array, a circuit for establishing a given potential on the bit lines of the memory array comprising:
    first and second bit-lines for the application of complementary signals thereto;
    a relatively high impedance, low power dissipation, static circuit coupled to said bit-lines tending to maintain the potential on said bit-lines at a first given potential, said relatively high impedance circuit comprising:
    (a) a high impedance current limiting element having its conduction path connected between a point of operating potential and a first node;
    (b) first and second diode-connected transistors having their conduction paths connected between said first node and said first and second bit lines, respectively; and
    (c) said high impedance current limitigg element functioning to limit the voltage drop across said first and second diodes and maintaining the current therethrough a linear function of the applied voltage when either one of said first and second bit lines is short-circuited to a second potential; and
    a pulsed precharge circuit coupled to said bit lines for momentarily precharging said bit-lines to said first given potential prior to a read or a write cycle, said precharge circuit having a much lower impedance than said static circuit for driving said bit lines to said first given potential quickly.

2. The combination as claimed in claim 1 wherein said pulsed precharge circuit includes:
    (a) first and second insulated-gate field-effect transistors (IGETs), each IGFET having source and drain electrodes defining the ends of a conduction path and a control electrode, and wherein the conduction paths of said first and second IGFETs are connected between said point of operating potential and said first and second bit lines, respectively;
    (b) means connected to the control electrode of said first IGFET and to the control electrode of said second IGFET for selectively and momentarily tunring them on; and
    (c) wherein the ON impedance of the conduction path of said first and second IGETs is relatively low compared to the impedance of said current limiting element.

3. The combination as claimed in claim 1 further including selectively enabled transmission gate means having a control electrode and a conduction path, said conduction path being connected between said first and said second bit lines for selectively clamping them together.

4. The combination as claimed in claim 1 wherein said first and second diode connected transistors are first and second insulated-gate field-effect transistors (IGFETs) of one conductivity type; and
    wherein said high impedance current limiting element is a third IGFET of opposite conductivity type to said one conductivity type.

5. The combination as claimed in claim 4 wherein each one of said first, second and third IGFETs has a source and a drain defining the ends of a conduction path and a control electrode for controlling the conductivity of its conduction path;
    wherein said third IGFET is connected at its source to said point of operating potential, at its drain to said first node, and at its gate to a point of fixed potential;
    wherein the sources of said first and second IGFETs are connected to said first and second bit lines, respectively; and
    wherein the gates and drains of said first and second IGFETs are connected to said first node.

6. The combination as claimed in claim 1 wherein said first and second diode connected transistors are first and second insulated-gate field-effect transistors (IGFETs) of one conductivity type; and
    wherein said high impedance current limiting element is an IGFET of opposite conductivity type to said one conductivity connected to conduct in the common source mode.

* * * * *